United States Patent [19]

Takeuchi et al.

[11] 4,357,621
[45] Nov. 2, 1982

[54] REVERSE CONDUCTING THYRISTOR WITH SPECIFIC RESISTOR STRUCTURES BETWEEN MAIN CATHODE AND AMPLIFYING, REVERSE CONDUCTING PORTIONS

[75] Inventors: Minami Takeuchi, Tokyo, Japan

[73] Assignee: Tokyo Shibaura Electric Co., Ltd., Japan

[21] Appl. No.: 89,102

[22] Filed: Oct. 29, 1979

Related U.S. Application Data

[63] Continuation of Ser. No. 802,069, May 31, 1977, abandoned.

[30] Foreign Application Priority Data

May 31, 1976 [JP] Japan ................................ 51-63243

[51] Int. Cl.³ .......................................... H01L 29/747
[52] U.S. Cl. ...................................... 357/39; 357/20; 357/51; 357/86
[58] Field of Search ...................... 357/38, 39, 51, 20, 357/86

[56] References Cited

U.S. PATENT DOCUMENTS

| | | | |
|---|---|---|---|
| 3,408,545 | 10/1968 | De Cecco et al. ................. | 357/38 |
| 3,914,783 | 10/1975 | Terasawa ........................... | 357/38 |
| 3,947,864 | 3/1976 | Yatsuo et al. ..................... | 357/39 |
| 4,296,427 | 10/1981 | Takeuchi et al. ................. | 357/38 |

OTHER PUBLICATIONS

J. Garrett, "The Evolution of a High-Power Fast-Switching Thyristor", Electrical Engineer, May 1971, vol. 48, #5, pp. 33–35.

*Primary Examiner*—Joseph E. Clawson, Jr.

*Attorney, Agent, or Firm*—Finnegan, Henderson, Farabow, Garrett & Dunner

[57] ABSTRACT

A reverse conducting thyristor includes a thyristor section, a diode section and a semiconductor separator section for electrically separating both the sections. The thyristor section includes: a first region of first conductivity type, a second region of a second conductivity type, a third region of the first conductivity type, a main emitter region of the second conductivity type, an auxiliary emitter region formed, with intervention of the exposed portion of said third region, facing at least a part of the periphery of said main emitter region which does not contact the separate section and a cathode electrode, an auxiliary gate electrode contacting the auxiliary emitter region and enclosing, with intervention of the exposed portion of the third region, at least a part of the periphery of said main emitter region which does not contact the separate section, and a main gate electrode formed on the exposure surface of the third region contacting the side wall of the auxiliary emitter region which does not face the main emitter region. The respective components are successively layered on a first electrode acting as an anode electrode. The diode section includes a fourth region of the second conductivity type formed on the first or anode electrode, a fifth region of the first conductivity type formed on the fourth region, and a second electrode formed on the fifth region and connected to the cathode electrode. The separate section includes a sixth region formed on the first electrode and of the first conductivity type, a seventh region formed on the sixth region and of the second conductivity type and an eighth region formed on the seventh region and of the first conductivity type. The resistance values of the semiconductor layers between the cathode electrode and the second electrode and between the cathode electrode and the auxiliary gate electrode are each 2 to 18 Ohms.

3 Claims, 14 Drawing Figures

THYRISTOR I

THYRISTOR II

THYRISTOR I

THYRISTOR II

REVERSE CONDUCTING THYRISTOR WITH SPECIFIC RESISTOR STRUCTURES BETWEEN MAIN CATHODE AND AMPLIFYING, REVERSE CONDUCTING PORTIONS

This is a continuation of application Ser. No. 802,069, filed May 31, 1977, abandoned.

BACKGROUND OF THE INVENTION

The present invention relates to a reverse conducting thyristor and, more particularly, to one for reducing the possibility of failure of the turn-off and destruction of the thyristor even if the turn-off should fail.

The reverse conducting thyristor includes in integral form a thyristor section and a diode section. This type thyristor generally is used for the chopper or inverter. This requires good turn-off performance for the thyristor. The improvement of the turn-off performance of the thyristor alone fails to prevent the failure of the turn-off when it is incorporated into a circuit. It is advisable, therefore, that the thyristor per se is hard to be destroyed even if the turn-off of the thyristor should fail.

For a better understanding of the reverse conducting thyristor, explanation will be made of a conventional chopper circuit using the reverse conducting type thyristors, referring to FIGS. 1 and 2A to 2D. As shown in FIG. 1, a main reverse conducting thyristor I is connected through a load M between the positive side and negative side of a DC power source. An auxiliary reverse conducting thyristor II is connected across the main thyristor I through a series circuit consisting of a capacitor C and an inductor L. In operation, a gate signal is applied to the gate of the thyristor I to make current $I_{DC}$ flow into the load M. Then, another gate signal is applied to the gate of the thyristor II to be conductive and to turn-off the main thyristor I. When the current $I_{DC}$ flows through the load M, the capacitor C is charged with the polarity as shown in the figure. When the auxiliary thyristor II is turned on, the current $I_{DC}$ and the discharge current from the capacitor C flow in superposition into the thyristor section of the main thyristor I during the period of time $t_o$, as shown in FIG. 2A. Then, in the period $t_{p1}$, the polarity of the capacitor C is reversed so that the discharge current from the capacitor C flows into the diode section of the thyristor I, thereby turning the thyristor I on. On the other hand, in the auxiliary thyristor II, discharge current with a pulse width $t_{p2}$ which is dependent on the circuit constant, flows into the thyristor section and diode section, as shown in FIG. 2B. The current flowing into the diode section of the main thyristor I equals the value that the current $I_{DC}$ is subtracted from the current flowing into the diode section of the auxiliary thyristor II. The conduction period $t_{p1}$ thereof is shorter than that $t_{p2}$ of the auxiliary thyristor II. The main thyristor I has no serious problem, since the current $I_{DC}$ flows to sufficiently spread the conduction area of the thyristor section and at this time the discharge current is superposed thereon during the period $t_0$. On the other hand, in the case of the auxiliary thyristor II, the current flowing into the thyristor section is of pulse and hence it flows concentrated in the vicinity of the gate of the thyristor section. The current concentration locally raises the temperature in the vicinity of the gate. For this reason, the turn-off time of the auxiliary thyristor II must be shorter than that of the main thyristor I. In the main thyristor I, when the turn-off time $t_{p1}$ of the circuit is shorter than that of the element, its turn-off operation fails. In the auxiliary thyristor II, when the turn-off time $t_{p2}$ of the circuit is shorter than that of the element due to the temperature rise in the vicinity of the gate of the thyristor section, the turn-off thereof fails. As mentioned referring to FIG. 2A, the conduction width $t_{p1}$ of the diode section of the main thyristor I is narrow. The peak value of the current flowing through the diode section of the auxiliary thyristor II is large. Therefore, the current reduction rate −di/dt in the diode sections of the main and auxiliary thyristors I and II is made small. This means that a large amount of charges resides in the diode sections. When the amount of the residual charges exceeds a predetermined value, the residual charges trigger the thyristor section to turn it on again, resulting in failure of the turn-off. FIG. 2C shows a wave form of the current in the main thyristor I at the turn-off failure, and FIG. 2D a wave form of the auxiliary thyristor II current at the turn-off failure. Particularly, the shaded wave forms in these figures appear at the turn-off failure.

As described above, the chopper circuit design is inherently accompanied by variation of the conduction period $t_{p1}$ of the current flowing through the diode section of the main thyristor and of $t_{p2}$ in the auxiliary thyristor II, and increment of the current reduction rate −di/dt in the diode sections of the main and auxiliary thyristors.

It is theoretically and practically possible to reduce the possibility of failure of the turn-off and destruction of the thyristor per se even if the turn-off should fail.

For avoiding the refiring of the thyristor due to the residual charges in the diode section, the countermeasure thus far taken is to provide an electric separation or isolation region or to accelerate the spreading rate of the thyristor current by using an auxiliary gate, i.e. a pilot gate. Such the contermeasures, however, fail to attain desired or satisfactory results.

Accordingly, an object of the present invention is to provide a reverse conducting thyristor reducing possibility of the turn-off failure and complete destruction of the thryistor even if failure of the turn-off should occur.

SUMMARY OF THE INVENTION

A reverse conducting thyristor of the invention has in integral form a thyristor section, a diode section, and a semiconductor separator section for preventing an electrical interference between the thyristor and diode sections. The thyristor section includes a first region of a first conductive type formed on a first electrode, a second region of a second conductivity type formed on the first region, a third region of the first conductivity type formed on the second region, a main emitter region of the second conductivity type formed in the third region, a cathode electrode formed on the main emitter region, an auxiliary emitter region formed, with intervention of the exposure layer of the third region, facing at least a part of the periphery of the main emitter region which does not contact the separator section, an auxiliary gate electrode contacting the auxiliary emitter region and enclosing, with intervention of the exposure portion of the third region, at least a part of the periphery of the main emitter region which does not contact the separator section, and a main gate electrode formed on the exposure surface of the third region contacting the side wall of the auxiliary emitter region which does not face the main emitter region. The diode section includes a fourth region of the second conductivity type formed on the first electrode, a fifth region of the first conductivity type formed on the fourth region, and a second electrode formed on the fifth region and connnected to the cathode electrode. The separator section includes a sixth region formed on the first electrode and of the first conductivity type, a seventh region formed on the sixth region and of the second conductivity type and an eighth region formed on the seventh region and of the first conductivity type. The resistance values of the semicoductor layers between the cathode electrode and the second electrode and between the cathode electrode and the auxiliary gate electrode are each 2 to 18 ohms.

Other objects and features of the present invention will be apparent from the following description taken in connection with the accompanying drawings, in which:

DETAILED DESCRIPTION OF THE PREFERRED EMBODIMENTS

Figure 3A:
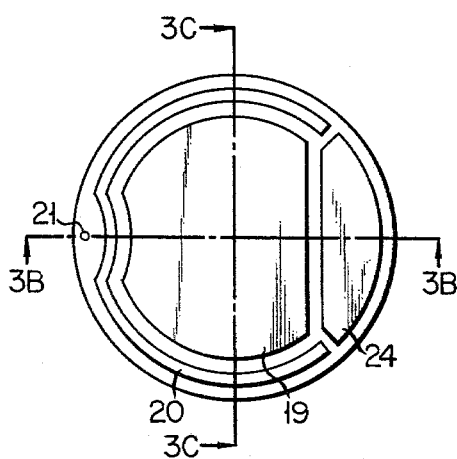
FIG. 3A is a plan view of an embodiment of a reverse conducting thyristor according to the present invention.
Figure 3B:
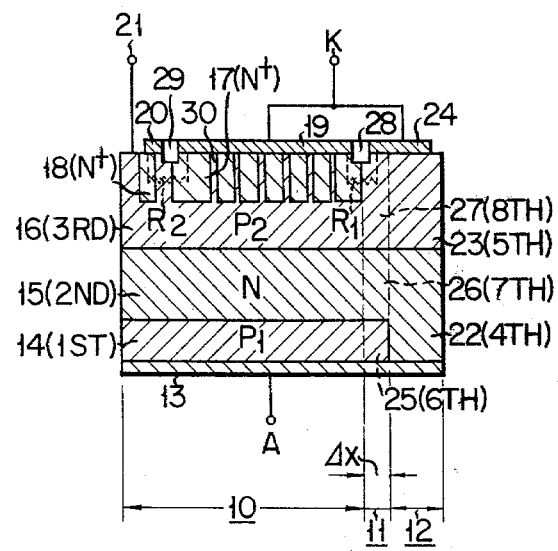
FIG. 3B is a cross sectional view taken along line 3B—3B of FIG. 3A.
Figure 3C:
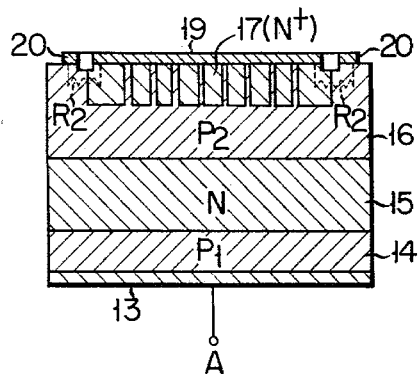
FIG. 3C is a cross sectional view taken along line 3C—3C of FIG. 3A.

Reference will now be made to FIGS. 3A to 3C illustrating a first embodiment of a reverse conducting thyristor of the invention. As shown, the reverse conducting thyristor comprises a thyristor section 10, a diode section 12, and a semiconductor separate section 11 for electrically separating the thyristor and diode sections. The thyristor section 10 comprises a first electrode 12, a first region (P1) 14 of, for example, p-conductivity type, a second region (N) 15 of, for example, n-conductivity type, and a third region (P2) 16 of, for example, p-conductivity type. These regions are successively multilayered on the first electrode 13. In the surface region of the third region a main emitter region (N+) 17 is formed with its side walls partly contacting the side wall of the separator section 11. An auxiliary emitter region (N+) 18 is embedded in the third region 16 at the opposite side to the one contacting the separator section 11. A cathode electrode 19 is layered over the main emitter region 17. An auxiliary gate electrode 20 is formed on the parts of the top surface of the auxiliary emitter region 18 and the exposure surface of the third region 16 sandwiched between the regions 17 and 18. As viewed from top in the drawing, the auxiliary gate electrode 20 is placed around a greater part of the periphery of the cathode electrode 19, with the exposure portion of the third region therebetween, as shown in FIG. 3A. The remaining part of the electrode 19 periphery is surrounded by a second electrode 24, with a groove 28 intervened therebetween. A main gate electrode 21 is connected to a part of the exposure surface of the third region 16 at the outer side of the auxiliary emitter region 18.

The diode section 12 comprises a 4th region (N) 22 which is an extension of the second region 15, a 5th region (P2) 23 which is an extension of the third region 16, and a second electrode 24 separated from the cathode electrode 19 by groove 28.

The separator region 11 comprises a 6th region (P1) 25 which is an extension of the first region 14, a 7th region (N) 26 which is an extension of the second region 15, and an 8th region (P2) 27 of an extension the third region 16. The separator section 11 contacts at one side the thyristor region 10 while at the other side the diode region 12. A part of the top exposure surface of the 8th region 27 contacts the second electrode 24.

The groove 28 is formed in the semiconductor layer lying between the cathode electrode 19 and the second electrode 24. The semiconductor layer has a surface layer resistance R1 of 2 to 18 ohms. Between the cathode electrode 19 and the auxiliary gate electrode 20, another groove 29 is formed in the semiconductor layer having a surface resistance R2 of 2 to 18 ohms. The main emitter region 17 has a lot of gaps 30 which are filled with the third region 16 of which the tops are exposed contacting the cathode electrode 19. That is, the so called shorted emitter is constructed in such a way. A part of the third region 16 serves to guide displacement current which is produced in the thyristor section and is proportional to the differentiation of a forward impression voltage V with respect to time t, dV/dt, to the cathode electrode 19.

The explanation to follow is the operation of the reverse conducting thyristor shown in FIGS. 3A to 3C. A forward voltage is first applied between the first electrode 13 serving as an anode for the thyristor section 10 and the cathode electrode 19, and then a gate voltage is applied between the main gate 21 and the cathode 19. Upon the application of the gate voltage, the auxiliary thyristor section corresponding to the auxiliary emitter region 18 is turned on, with the result that the potential of the auxiliary gate electrode 20 rises. With the potential rise, the main thyristor corresponding to the main emitter region 17 is turned on. In this case, the turn-on area gradually spreads along the entire periphery of the main emitter region 17 facing the auxiliary gate electrode 20. This, therefore, improves the di/dt endurance of the thyristor, where i is thyristor current. From the fact that the turn-on area of the thyristor starts to spread from most of the entire periphery of the emitter region 17, it will be apparent that the possibility of failure of turn-on due to temperature rise in the vicinity of the gate is reduced as previously mentioned, and that, even if a thyristor current with large di/dt flows after failure of the turn-on, possibility of complete destruction of the thyristor device is also reduced. However, the resistance value of the semiconductor layer between the cathode electrode 19 and the auxiliary gate electrode 20 must be properly selected. When the resistance value is too small, current flowing from the auxiliary gate electrode 20 to the cathode electrode 19 is large to possibly melt the terminal of the cathode electrode. Conversely, when the resistance value is too large, the current is small, resulting in deterioration of current injection efficiency, and thus the di/dt endurance. For example, in the case of the thyristor with 2,500 V forward voltage, if the resistance value becomes below 1 ohm, the di/dt endurance suddenly reduces to be below 100 A/μs; if it is above 18 ohms, the di/dt endurance becomes below 200 A/μs. It is for this reason that, in the reverse conducting thyristor of the invention, the resistance value is restricted to be 2 to 9 ohms.

The dV/dt endurance must also be set up within a predetermined range. The resistance value $R_2$ of the semiconductor layer between the auxiliary gate electrode 20 and the cathode electrode 19 is given by the equation (1)

$$V < C \times S \times dV/dt \times R_{(RG-K)} \qquad (1)$$

where V is a threshold voltage (about 0.5 V) of the PN junction between the second region 15 and the third region 16, C a junction capacitor of the PN junction, S an area of the semiconductor layer laid outside the cathode electrode 19 in the thyristor section 10, and I the whole displacement current produced in the same semiconductor region. The equation (1) may be rewritten $$dV/dt < (V/CS) \times 1/R_2 \qquad (2)$$

Figure 7:
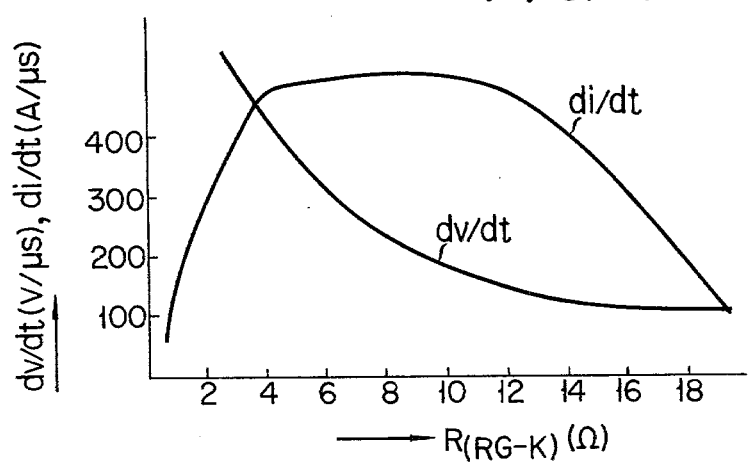
FIG. 7 shows the characteristic curves of dV/dt and di/dt values versus resistance of the semiconductor surface layer between a cathode electrode and an auxiliary gate electrode in the thyristor section of the reverse conducting thyristor of the invention.

The equation (2) shows that the dV/dt endurance is inversely proportional to $R_2$. Accordingly, in the above-mentioned thyristor, if the $R_2$ is above 18 Ohms, the dV/dt endurance is below 100 V/μs. Therefore, it is very difficult to design chopper circuits by using such the thyristor. FIG. 7 shows the interrelationship of the resistance $R_2$ versus the endurances dV/dt and di/dt.

Figure 1:
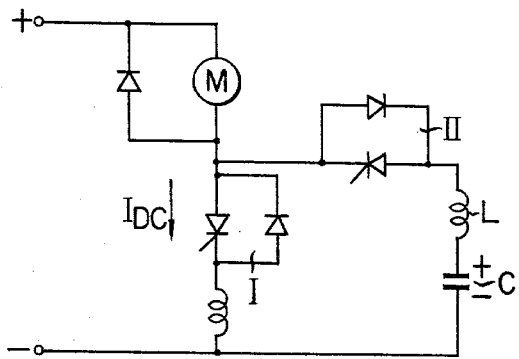
FIG. 1 shows a circuit diagram of an example of chopper circuits including reverse conducting thryistors, which is of conventional type.
Figure 2A:
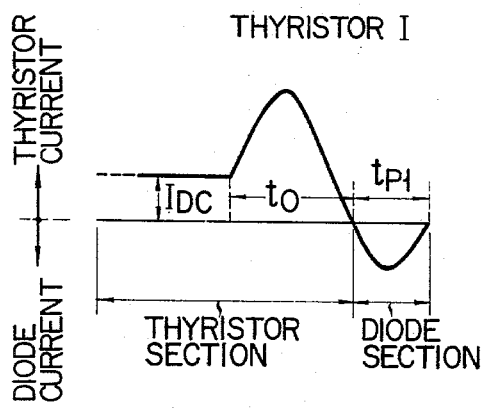
FIGS. 2A to 2D show wave forms of currents conducting in the reverse conducting thyristors used in the chopper circuit shown in FIG. 1.
Figure 2B:
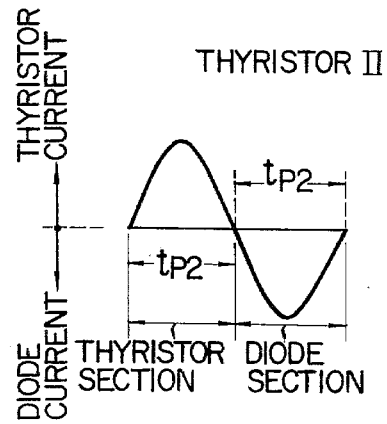
Figure 2C:
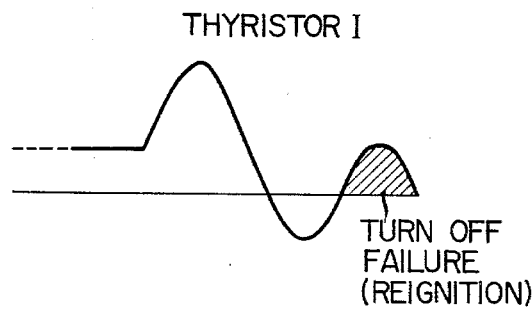
Figure 2D:
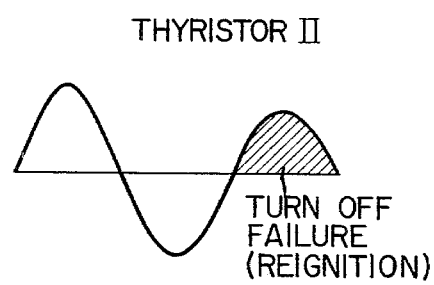

Let us now consider the diode section 12. As recalled, the current flowing into the diode section is of pulses with narrow width and high peak value. See FIGS. 2A and 2B. When such current flows into the diode section 12, a comparatively large amount of residual charges remains in the diode section 12 at the turn-off of the current. In the case of much of residual charges, such charges flow into the thyristor section 10 through the separator section 11, as described previously. This causes the thyristor section to be turned on again, resulting in failure of the turn-off. In this case, the failure of the turn-off may be avoidable by increasing the thickness Δx of the separation section 11, although the residual charges tend to flow along the top surface of the separation section into the main emitter section 17, thus possibly giving rise to the turn-on. At this point, it is to be noted that the thyristor device of the invention has the restrictive value 2 to 18 ohms of the resistance $R_1$ between the second electrode 24 and the cathode electrode 19. This resistance $R_1$ suppresses occurrence of the failure of the turn-off. FIG. 7 also shows the interrelationship of the resistance $R_1$ to the endurances dv/dt and di/dt.

From the foregoing description, it will be understood that the thyristor devices of the invention successfully prevent the localized temperature rise in the thyristor section and refiring of the thyristors due to the residual charges in the diode section. Accordingly, possibility of occurrence of the failure of the turn-off is reduced and, if the failure should occur, the destruction of the devices is minimized, as compared to the conventional ones.

Figure 4A:
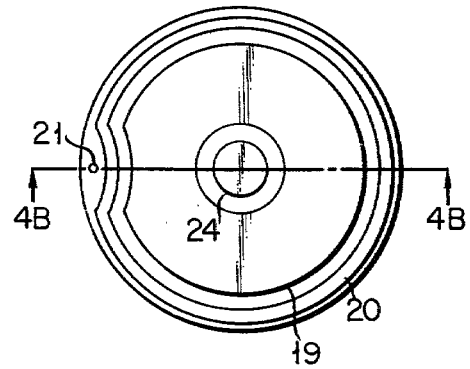
FIG. 4A is a plan view of another embodiment of the reverse conducting thyristor according to the invention.
Figure 4B:
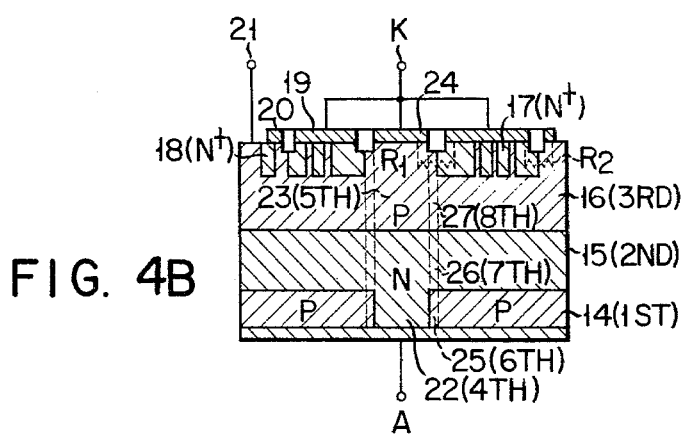
FIG. 4B is a cross sectiona view taken along line 4B—4B of FIG. 4A.

A modification of the embodiment of FIG. 3 of the invention is shown in FIGS. 4A and 4B. In this example, like reference numerals are used to designate like portions in FIGS. 3A to 3C. As shown, the main emitter region 17 is entirely surrounded by the auxiliary gate electrode 20, with intervention of a part of the third region 16. 2 to 18 ohms resistance value is employed for the resistance values $R_1$ and $R_2$ of the semiconductor layers laying between the cathode electrode 19 and the second electrode 24 and between the cathode electrode 19 and the auxiliary gate electrode 20. This example with the same effects as the FIG. 3 one is effective in application of it for the case of narrow conduction width of the thyristor section.

Figure 5A:
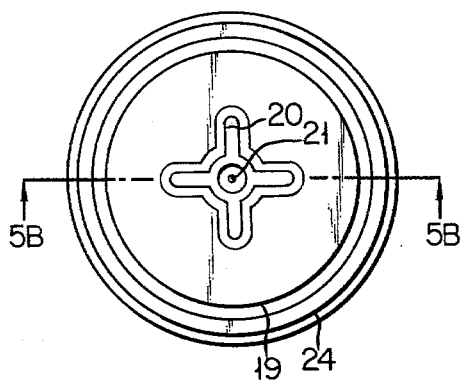
FIG. 5A is a plan view of still another embodiment of the reverse conducting thyristor of the invention.
Figure 5B:
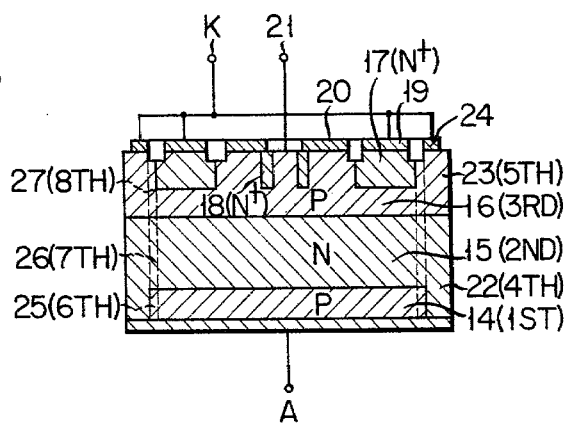
FIG. 5B is a cross sectional view taken along line 5B—5B of FIG. 5A.

Another modification shown in FIGS. 5A and 5B employs a ring diode, and is effective when it is applied for the thyristor device of which the conduction pulse in the thyristor section has high peak value. The operation and effects of this example are equivalent to those of the first example. Like portions are designated by like reference numerals in the first example. No detailed description of the example will be necessary for those skilled in the art.

Figure 6:
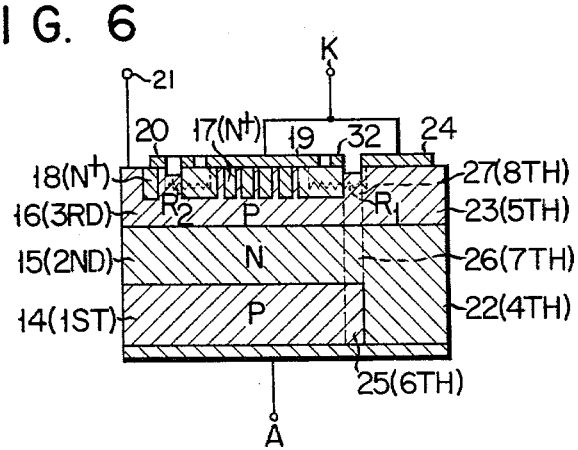
FIG. 6 is a cross sectional view of a further embodiment of the reverse conducting thyristor of the invention.

FIG. 6 shows still another embodiment of the reverse conducting thyristor of the invention. The difference between this embodiment and the FIG. 3 embodiment is the use of a field initiate (FI) gate electrode 32 separated from the cathode electrode 19, by which the main emitter region 17 is surrounded, as shown in the figure. 2 to 18 ohms may be used for the resistance values $R_1$ and $R_2$ of the semiconductor layers between the cathode electrode 19 and the auxiliary gate electrode 20 and between the cathode electrode 19 and the second electrode 24. The operation and effects of this example are equivalent to those of the first example of FIG. 3. Details of further description of the example will be omitted.

What we claim is:

1. A reverse conducting thyristor comprising in an integral form a thyristor section, a diode section and a semiconductor separator section for preventing an electrical interference between the thyristor section and the diode section, in which said thyristor section includes a first region of a first conductivity type formed on a first electrode; a second region of a second conductivity type formed on said first region; a third region of the first conductivity type formed on said second region; a main emitter region of the second conductivity type formed in said third region; a cathode electrode formed on said main emitter region; an auxiliary emitter region formed, with intervention of the exposure layer of said third region, facing at least a part of the periphery of said main emitter region which does not contact said separator section; an auxiliary gate electrode contacting said auxiliary emitter region and enclosing, with intervention of the exposure portion of said third region, at least a part of the periphery of said main emitter region which does not contact said separate section; and a main gate electrode formed on the exposure surface of said third region contacting the side wall of said auxiliary emitter region which does not face said main emitter region; said diode section includes a fourth region of the second conductivity type formed on said first electrode; a fifth region of the first conductivity type formed on said fourth region; and a second electrode formed on said fifth region and connected to said cathode electrode; and said separator section includes a sixth region formed on said first electrode and of the first conductivity type, a seventh region formed on said sixth region and of the second conductivity type and an eighth region formed on said seventh region and of the first conductivity type; resistor means including a groove between said cathode electrode and said second electrode in which the resistance values of the semiconductor layers between said cathode electrode and said second electrode and between said cathode electrode and said auxiliary gate electrode are each 2 to 18 Ohms.

2. The reverse conducting thyristor set forth in claim 1, in which said diode section takes the form of a column centered in the axis at the substantial center of said first electrode, said separator section takes the form of a cylinder enclosing said column-shaped diode section, while contacting the periphery thereof, said thyristor section takes the form of a cylinder contacting the periphery of said cylinder-shaped separator section, and said auxiliary gate electrode encloses the entire periphery of said main emitter region with intervention of the exposure layer of said third region.

3. The reverse conducting thyristor set forth in claim 1, in which said thyristor region takes the form of a column centered in the axis at the substantial center of said first electrode, said separator section takes the form of a cylinder, contacting the periphery of said column-shaped thyristor region, said diode section takes the form of a cylinder, contacting the periphery of said cylinder-shaped separator section, said auxiliary emitter region shaped as a ring is formed on the central portion of said third region of said column-shaped thyristor section, and said main gate electrode is formed on the exposure portion of said third region within said ring, and said main emitter region encloses said auxiliary emitter region with intervention of the exposure portion of said third region, contacting the inner wall of said separator section.

* * * * *

UNITED STATES PATENT AND TRADEMARK OFFICE
CERTIFICATE OF CORRECTION

PATENT NO. : 4,357,621
DATED : November 2, 1982
INVENTOR(S) : Minami Takeuchi

It is certified that error appears in the above—identified patent and that said Letters Patent is hereby corrected as shown below:

On the title page,
under the "Foreign Application Priority Data" change "51-63243" to -- 51-63242 --.

Signed and Sealed this

Sixteenth Day of October 1984

[SEAL]

Attest:

GERALD J. MOSSINGHOFF

Attesting Officer

Commissioner of Patents and Trademarks